(12) United States Patent
Suzuki et al.

(10) Patent No.: US 11,049,729 B2
(45) Date of Patent: Jun. 29, 2021

(54) DRY ETCHING METHOD, SEMICONDUCTOR DEVICE MANUFACTURING METHOD, AND CHAMBER CLEANING METHOD

(71) Applicant: Central Glass Company, Limited, Ube (JP)

(72) Inventors: Shoi Suzuki, Ube (JP); Akifumi Yao, Ube (JP)

(73) Assignee: Central Glass Company, Limited, Ube (JP)

( * ) Notice: Subject to any disclaimer, the term of this patent is extended or adjusted under 35 U.S.C. 154(b) by 0 days.

(21) Appl. No.: 16/480,385

(22) PCT Filed: Mar. 19, 2018

(86) PCT No.: PCT/JP2018/010684
§ 371 (c)(1),
(2) Date: Jul. 24, 2019

(87) PCT Pub. No.: WO2018/180655
PCT Pub. Date: Oct. 4, 2018

(65) Prior Publication Data
US 2019/0355590 A1   Nov. 21, 2019

(30) Foreign Application Priority Data
Mar. 28, 2017  (JP) .............................. JP2017-062342

(51) Int. Cl.
*C23F 4/02*   (2006.01)
*H01L 21/3213*   (2006.01)
(Continued)

(52) U.S. Cl.
CPC .......... *H01L 21/32135* (2013.01); *C23F 4/02* (2013.01); *H01L 21/32139* (2013.01); *H01L 43/12* (2013.01); *H01L 27/222* (2013.01)

(58) Field of Classification Search
None
See application file for complete search history.

(56) References Cited

U.S. PATENT DOCUMENTS

| | | | | |
|---|---|---|---|---|
| 4,498,953 A | * | 2/1985 | Cook | .................. C04B 41/5346 148/DIG. 105 |
| 5,534,107 A | * | 7/1996 | Gray | ..................... B08B 7/0057 438/708 |

(Continued)

FOREIGN PATENT DOCUMENTS

| | | |
|---|---|---|
| JP | 2002-175986 A | 6/2002 |
| JP | 2004-228487 A | 8/2004 |

(Continued)

OTHER PUBLICATIONS

International Search Report (PCT/ISA/210) issued in PCT Application No. PCT/JP2018/010684 dated May 29, 2018 with English translation (three pages).

(Continued)

*Primary Examiner* — Allan W. Olsen
(74) *Attorney, Agent, or Firm* — Crowell & Moring LLP

(57) ABSTRACT

Disclosed is a dry etching method which includes: a first step of bringing a processing gas containing a fluorine-containing interhalogen compound into contact with a material containing a specific metal element at a reaction temperature of 0° C. to 100° C., thereby forming a reaction product of the specific metal element and the fluorine-containing interhalogen compound as a solid product; and a second step of evaporating the solid product by heating the solid product in an inert gas atmosphere or vacuum atmosphere at a temperature higher than the reaction temperature of the first step, wherein the specific metal element is one or more kinds of elements selected from the group consisting of Ru, Ta, and Nb.

18 Claims, 1 Drawing Sheet

(51) Int. Cl.
*H01L 43/12* (2006.01)
*H01L 27/22* (2006.01)

(56) References Cited

U.S. PATENT DOCUMENTS

| | | | | |
|---|---|---|---|---|
| 5,954,884 | A * | 9/1999 | Lawing | H01L 21/02046 134/1 |
| 6,083,413 | A * | 7/2000 | Sawin | B08B 7/0057 216/104 |
| 6,124,211 | A * | 9/2000 | Butterbaugh | B08B 7/0057 134/1 |
| 6,207,570 | B1 * | 3/2001 | Mucha | H01L 21/02063 257/E21.31 |
| 2002/0011465 | A1 * | 1/2002 | Yamamoto | C23C 16/4405 216/75 |
| 2007/0241417 | A1 * | 10/2007 | Huibers | H01L 31/02327 257/436 |
| 2008/0305633 | A1 * | 12/2008 | Itatani | C23C 16/4405 438/686 |
| 2010/0267242 | A1 * | 10/2010 | Lebouitz | H01L 21/32135 438/708 |
| 2011/0111532 | A1 | 5/2011 | Ryu et al. | |
| 2015/0214474 | A1 | 7/2015 | Nishimura et al. | |
| 2015/0270140 | A1 * | 9/2015 | Gupta | H01L 21/32136 216/67 |
| 2017/0200602 | A1 * | 7/2017 | Kikuchi | H01L 21/3065 |

FOREIGN PATENT DOCUMENTS

| | | |
|---|---|---|
| JP | 2008-121054 A | 5/2008 |
| JP | 2008-297605 A | 12/2008 |
| JP | 2011-103467 A | 5/2011 |
| JP | 2011-227223 A | 11/2011 |
| JP | 2014-49466 A | 3/2014 |
| JP | 2017-59824 A | 3/2017 |

OTHER PUBLICATIONS

Japanese-language Written Opinion (PCT/ISA/237) issued in PCT Application No. PCT/JP2018/010684 dated May 29, 2018 (four pages).

Taiwanese-language Office Action issued in counterpart Taiwanese Application No. 107110418 dated Feb. 21, 2019 (seven pages).

* cited by examiner

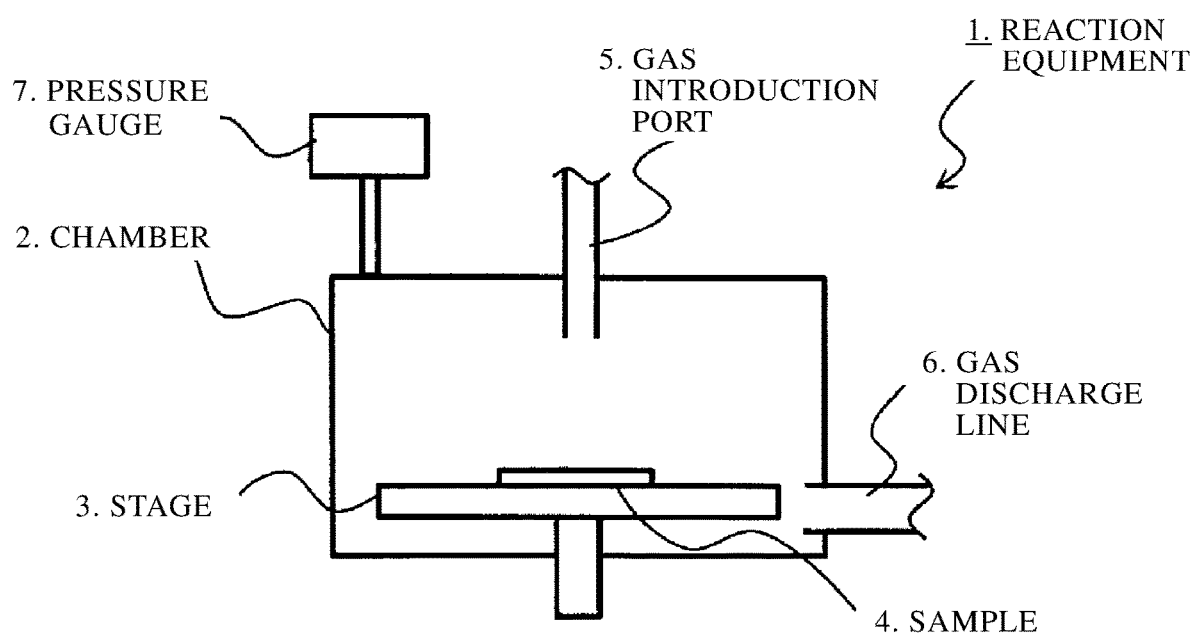

DRY ETCHING METHOD, SEMICONDUCTOR DEVICE MANUFACTURING METHOD, AND CHAMBER CLEANING METHOD

FIELD OF THE INVENTION

The present invention relates to a dry etching method for a material containing a specific metal element such as Ru or Ta and the like.

BACKGROUND ART

Nowadays, various types of nonvolatile memory devices such as magnetic memory (MRAM) devices and phase change memory (PRAM or PCRAM) devices have been developed as new memory devices in lieu of NAND flash memory devices and DRAM devices. In the development of these new memory devices, transition metals such as Ta and noble metals such as Ru have come into use as device-constituting magnetic materials and wiring materials in place of conventional Si-based materials such as $SiO_x$, SiN and SiON. Transition metal nitrides such as TaN have also come into use as barrier layers (diffusion preventive films) for preventing diffusion of metal elements into silicon-based materials.

With such changes of device-constituting materials, it becomes necessary to change dry processing techniques for devices. Dry processing techniques for device-constituting materials deposited in chambers of device manufacturing apparatuses are thus forced to be changed from conventional ones. For example, plasma processing and cleaning techniques using fluorocarbons, which are known as etching methods for Si-based compounds, face the problem that it is difficult to convert a material containing a stable element such as Ru or Ta to a volatile compound and thereby difficult to remove the material from a surface of the device and an inner surface of the chamber.

As a method of removing a Ru- or Ta-containing material from a device surface etc., generally known is a wet etching process in which the material is dissolved and ionized by immersion in a strong acid solution. When the wet etching process accompanied by immersion and dissolution in the strong acid solution is applied as an etching process for the manufacturing of a device, however, even a part of the device not originally intended to be etched is reacted with the strong acid solution so that the characteristics of the device would be impaired. When the wet etching process is applied as a process for the cleaning of a chamber, it is necessary to open the reaction system. There has hence been a demand for a method of removing a Ru- or Ta-containing material from a chamber surface etc. by a dry process.

As a technique for dry process etching of a MRAM device having a multi-layer film structure with a metal laminated film containing Co, Fe, B, Pd, Pt, Mn, Ir, Ru, Mg, Ti, W etc., disclosed is an etching method which includes exciting a $PF_3$ gas in a plasma, forming a complex of a metal and the excited gas and removing the complex from a surface of the device (see Patent Document 1).

A method is disclosed in which an etching target film containing Co, Fe, Tb, Ru, Pd, Pt, Mn etc. for use in a MRAM or PRAM device is subjected to plasma reactive etching with an ammonia gas and a fluorine-containing gas so as to form a pattern structure (see Patent Document 2).

Further, a method is disclosed in which a thin film formed on a substrate and containing a general transition metal such as Ir, Ru, Pt, Ph, Au or Re and at least one of typical metal elements of the second and subsequent periods of the periodic table is subjected to plasma dry etching with a chlorine-containing gas, a fluorine-containing gas, argon and oxygen (see Patent Document 3).

As for etching of Ta, on the other hand, an etching example is disclosed in which a translucent Ta film of 4 nm thickness on a synthetic quartz glass substrate is etched with a mixed gas of $ClF_3$ and Ar under the conditions of a gas pressure of 488 to 502 Torr, a temperature of 110 to 120° C. and a processing time of 32 seconds without using a plasma (see Patent Document 4).

PRIOR ART DOCUMENTS

Patent Documents

Patent Document 1: Japanese Laid-Open Patent Publication No. 2014-49466
Patent Document 2: Japanese Laid-Open Patent Publication No. 2011-103467
Patent Document 3: Japanese Laid-Open Patent Publication No. 2004-228487
Patent Document 4: Japanese Laid-Open Patent Publication No. 2011-227223

SUMMARY OF THE INVENTION

As mentioned above, there are known the methods for removing the device-constituting material from the processing target object such as device surface or chamber inner surface. The methods disclosed in Patent Documents 1, 2 and 3 allow etching of the metal element-containing film by exciting the etching gas in the plasma and reacting the metal element-containing film with the excited etching gas, but face the following problems. In the case where the etching target is a magnetic material, the magnetic properties of the material may be adversely influenced by the plasma. In addition, it is necessary to use an RF power source for generation of the plasma, which results in a high cost of semiconductor device manufacturing apparatus. For these reasons, a plasma-less process is desired.

It is conceivable to remove a device-constituting material such as Ru, Ta or TaN by reacting the material with e.g. $F_2$ and thereby converting to the material to a highly volatile fluoride. In the case of not using a plasma, however, the temperature of the reaction of Ru with the $F_2$ gas is 300° C. or higher; and the temperature of the reaction of Ta with the $F_2$ gas is 150° C. or higher. In other words, the reaction needs to be performed at a high temperature in the atmosphere of $F_2$ gas. Under such high-temperature conditions, any material other than the etching target, such as silicon or silicon oxide, is noticeably damaged. It is thus difficult to apply this technique to a semiconductor device manufacturing process.

The method disclosed in Patent Document 4 allows etching of the thin film of Ta simple substance from the surface of the substrate by the use of $ClF_3$ in an unexcited state. However, damage to the substrate is large as the gas is heated to a temperature of 110° C. or higher. In the case of etching a Ru simple substance or Ta nitride which is more stable than Ta simple substance, the gas needs to be heated to a further higher temperature. It consequently becomes difficult to suppress damage to the substrate or corrosion of the chamber.

In view of the foregoing, it is a purpose of the present invention to provide a method for removing, from a processing target object, a material containing a stable metal element such as Ru or Ta by a plasma-less dry process without bringing a fluorine-containing gas into contact with the processing target object under a high-temperature condition exceeding 100° C.

Means for Solving the Problems

The present inventors have made extensive researches to achieve the above object and resultantly found that it is possible to remove, from a surface of an device-constituting material and from a chamber inner surface of a device manufacturing apparatus, a material containing a metal element such as Ru or Ta by bringing a fluorine-containing interhalogen compound into contact with the metal element to form a reaction product of the metal element and the fluorine-containing interhalogen compound as a solid product and then evaporating the solid product under heating in an inert gas atmosphere or the like. The present invention is based on this finding.

According to a first aspect of the present invention, there is provided a dry etching method comprising: a first step of bringing a processing gas containing a fluorine-containing interhalogen compound into contact with a material containing a specific metal element at a reaction temperature of 0° C. to 100° C., thereby forming a reaction product of the specific metal element and the fluorine-containing interhalogen compound as a solid product; and a second step of evaporating the solid product by heating the solid product in an inert gas atmosphere or vacuum atmosphere at a temperature higher than the reaction temperature of the first step, the specific metal element being one or more kinds of elements selected from the group consisting of Ru, Ta and Nb.

According to a second aspect of the present invention, there is provided a semiconductor device manufacturing method, comprising: forming a layer of the material containing the specific metal element on a semiconductor substrate; forming a mask with a predetermined pattern on the layer of the material containing the specific metal element; and removing a part of the layer of the material containing the specific metal element from the semiconductor substrate by the above dry etching method and thereby transferring the pattern to the layer of the material containing the specific metal element.

According to a third aspect of the present invention, there is provided a chamber cleaning method, comprising: a first step of bringing a processing gas containing a fluorine-containing interhalogen compound into contact with a chamber deposit containing a specific metal element at a reaction temperature of 0° C. to 100° C., thereby forming a reaction product of the specific metal element and the fluorine-containing interhalogen compound as a solid product; and a second step of evaporating the solid product by heating the solid product in an inert gas atmosphere or vacuum atmosphere at a temperature higher than the reaction temperature of the first step, thereby removing the chamber deposit from an inner surface of the chamber, the specific metal element being one or more kinds of elements selected from the group consisting of Ru, Ta and Nb.

Effects of the Invention

According to the present invention, it is possible to etch the material containing the stable metal material such as Ru or Ta by a plasma-less dry process without bringing a fluorine-containing gas into contact with the processing target object under a high-temperature condition exceeding 100° C.

The present invention is applicable for the manufacturing of a semiconductor device and for the cleaning of a device manufacturing apparatus, whereby the material containing the stable metal element is removed from a surface of the semiconductor device and from a chamber inner surface of the device manufacturing apparatus by the plasma-less dry process.

BRIEF DESCRIPTION OF THE DRAWINGS

FIG. 1 is a schematic view of reaction equipment 1 used in Examples and Comparative Examples.

DETAILED DESCRIPTION OF THE EMBODIMENTS

Hereinafter, embodiments of the present invention will be described in detail below. It should be understood that the present invention is not limited to the following embodiments; and various changes and modifications of the following embodiments are possible within the range that does not impair the effects of the present invention.

A dry etching method according to the present invention enables dry-process etching of a material containing a stable specific metal element such as Ru or Ta through the following steps: a first step of bringing a processing gas containing a fluorine-containing interhalogen compound into contact with the material containing the specific metal element at a reaction temperature of 0° C. to 100° C., thereby forming a solid product; and a second step of evaporating the solid product by heating the solid product in an inert gas atmosphere or vacuum atmosphere at a temperature higher than the reaction temperature of the first step.

In the first step, the processing gas containing the fluorine-containing interhalogen compound is brought into contact with the material containing the specific metal element. By the reaction of the specific metal element and the fluorine-containing interhalogen compound, the solid product is formed on a surface of the material or in the entire material. In the subsequent second step, the solid product is heated in the inert gas atmosphere or vacuum atmosphere and thereby evaporated and removed from the material. As a result of these steps, the surface of the material or the entire material is etched. The first and second steps may be performed repeatedly.

The fluorine-containing interhalogen compound is preferably one or more kinds of compounds selected from the group consisting of ClF, BrF, $ClF_3$, $BrF_3$, $IF_3$, $ClF_5$, $BrF_5$, $IF_5$ and $IF_7$. The fluorine-containing interhalogen compound is more preferably $ClF_3$ (chlorine trifluoride), $IF_7$ (iodine heptafluoride) or a mixture thereof in terms of availability and ease of handling.

The specific metal element is preferably one or more kinds of elements selected from the group consisting of Ru (ruthenium), Ta (tantalum) and Nb (niobium). Further, it is preferable that the specific metal element is in the form of a simple substance or nitride thereof. As the simple substance, preferred are a simple substance of Ru, a simple substance of Ta and a simple substance of Nb. As the nitride, a nitride of Ta is preferred. The material is not limited to those substantially consisting of the simple substance or compound of the specific metal element. The dry etching method is applicable to any material containing 30 mass % or more, preferably 50 mass % or more, of the simple substance or compound of the specific metal element. (In other words, the material can be an alloy with another metal element or a material containing any impurity.) There is no particular limitation on the shape of the material containing the specific metal element. The material containing the specific metal element can be in a powder shape, a foil shape or a thin-film shape.

In the first step, the reaction temperature needs to be higher than or equal to a temperature at which the fluorine-containing interhalogen compound contained in the processing gas exists as a gas (that is, higher than or equal to a boiling point of the fluorine-containing interhalogen compound). The reaction temperature, even when higher than or equal to such a temperature, is preferably higher than or equal to 0° C. and lower than or equal to 100° C., more preferably higher than or equal to 10° C. and lower than or equal to 80° C., still more preferably higher than or equal to 15° C. and lower than or equal to 50° C. When the reaction temperature of the first step is too low, the progress of the reaction becomes slow so that the amount of etching in the second step may decrease. When the reaction temperature of the first step is too high, there may occur damage to a part of the device or equipment not originally intended to be etched.

In the second step, the solid product is preferably heated at the temperature higher than the reaction temperature of the first step in order to allow quick evaporation of the solid product. The heating temperature of the second step can be set to any degree as long as the solid product is capable of being evaporated under the heating temperature. The heating temperature is preferably higher than or equal to 50° C. and lower than or equal to 250° C., more preferably higher than or equal to 100° C. and lower than or equal to 200° C. In particular, tantalum nitride can be etched under a low temperature condition higher than or equal to 50° C. and lower than or equal to 100° C. When the heating temperature of the second step is too low, the etching grade may become low. When the heating temperature of the second step is too high, excessive time and energy would be required for the heating. The heating temperature of the second step is preferably 5° C. or more higher, more preferably 10° C. or more higher, still more preferably 20° C. or more higher, than the reaction temperature of the first step.

In order to obtain a sufficient reaction rate, the concentration of the fluorine-containing interhalogen compound in the gas flowing in the first step, that is, the processing gas is preferably 1 vol % or higher, more preferably 10 vol % or higher, based on the total flow amount of the processing gas.

At least one kind of diluent gas selected from inert gases such as $N_2$, He and Ar may be mixed in the processing gas used in the first step. The concentration of the inert gas in the processing gas is not particularly limited and is set within the range of e.g. 0 vol % to 90 vol %.

The pressure inside the chamber of the reaction equipment in the first step is not particularly limited and is generally in the range of e.g. 0.1 kPa to 101.3 kPa. The flow rate of the processing gas is set as appropriate, within the range that the pressure inside the chamber can be maintained constant, according to the size of the chamber and the capacity of the evacuation equipment.

The inert gas atmosphere used in the second step is preferably an atmosphere in which at least one kind of inert gas selected from the group consisting of $N_2$, He, Ne, Ar, Kr and Xe flows at 0.1 kPa to 101.3 kPa. The vacuum atmosphere used in the second step is preferably an atmosphere whose pressure is reduced to 0.1 Pa to 100 Pa.

In the first step, $ClF_3$ gas reacts with Ru, TaN etc. at ordinary temperatures to form a reaction product which is assumed to be a fluoro-halogeno metal complex (e.g. $[ClF_2][MF_6]$ where M is the metal element such as Ru or Ta). The formation of such a reaction product leads to a weight increase. Since the melting and boiling points of the fluorohalogeno metal complex are lower than those of the simple substance, nitride or oxide of the metal element, the fluorohalogeno metal complex is evaporated and removed by the heating in the second step. The dry etching method according to the present invention is applicable for the case where the material containing the other specific metal element is etched using the other fluorine-containing interhalogen compound because, even in such a case, a similar reaction occurs between the other fluorine-containing interhalogen compound and the other metal element.

The fluorine-containing interhalogen compound such as $ClF_3$ hardly reacts with silicon oxide, silicon nitride and titanium nitride under a temperature condition of 100° C. or lower or in an unexcited state. The dry etching method according to the present invention thus enables, in the case where the etching target includes both of a material containing silicon oxide, silicon nitride or titanium nitride and the material containing the specific metal element, selective etching of the material containing the specific metal element with almost no etching of the material containing silicon oxide, silicon nitride or titanium nitride. In particular, the dry etching method is advantageous in that the selectivity of the material containing the specific metal element relative to the material containing silicon oxide, silicon nitride or titanium nitride is 50 or higher. Depending on the conditions, the selectivity can be controlled to be 100 or higher.

There is a case where a thin film of the material containing the specific metal element is formed as a ferromagnetic layer or electrode layer on a semiconductor substrate for manufacturing of a semiconductor memory device. The dry etching method according to the present invention is applicable for the patterning of such a specific metal element-containing thin film layer. More specifically, a layer of the material containing the specific metal element is formed on the semiconductor substrate. A mask with a predetermined pattern is formed on the thus-formed specific metal element-containing layer. The dry etching method according to the present invention is then applied to the specific metal element-containing layer so as to transfer the pattern of the mask to the specific metal element-containing layer, whereby the ferromagnetic layer or electrode layer of the semiconductor memory device is obtained.

There is also a case where a wiring of a semiconductor device is formed using the material containing the specific metal element. The dry etching method according to the present invention is also applicable for the formation of such a wiring in the semiconductor device. More specifically, a layer of the material containing the specific metal element is formed on a semiconductor substrate. A mask with a predetermined wiring pattern is formed on the thus-formed specific metal element-containing layer. The dry etching method according to the present invention is then applicable to the specific metal element-containing layer so as to transfer the wiring pattern of the mask to the specific metal element-containing layer, whereby the wiring of the semiconductor device is obtained.

Particularly in the case where the substrate used is a silicon substrate having a silicon oxide layer on a surface thereof; and the specific metal element-containing layer is formed on the silicon oxide layer of the silicon substrate, the dry etching method according to the present invention enables etching of the specific metal element-containing layer without influence on the silicon substrate and the silicon oxide layer.

Further, the dry etching method according to the present invention has no need to heat the fluorine-containing interhalogen compound to a high temperature of 100° C. or higher and no need to excite the fluorine-containing interhalogen compound into a plasma state etc. so that it is possible to prevent corrosion of the chamber and piping of the reaction equipment during the etching.

The present invention can also be embodied as a method for cleaning a deposit of the material containing the specific metal element on the inner surface of the chamber (referred to as chamber deposit) under similar conditions to those of the above-mentioned etching method. For example, the cleaning method is applicable for the cleaning of an undesired chamber deposit after the step of forming or etching a film of the specific metal element-containing material on a substrate.

EXAMPLES

The present invention will be described in more detail below by way of the following examples and comparative examples. It should however be understood that the present invention is not limited to the following examples.

FIG. 1 is a schematic view of reaction equipment 1 used in Examples and Comparative Examples. In the reaction equipment, a stage 3 equipped with a heater function was located inside a chamber 2. Further, a heater was located around the chamber so as to heat a wall of the chamber. A sample 4 was placed on the stage 3 and subjected to etching by contact with a dry etching agent. The dry etching agent was introduced into the chamber through a gas introduction port 5 which was provided on an upper portion of the chamber, whereas the gas inside the chamber 2 was discharged through a gas discharge line 6. The chamber 2 was configured to be evacuatable to a vacuum. A pressure gauge 7 was mounted to the chamber 2.

Example 1-1

In the first step, a Ru powder (average particle size: 45 μm, purity: 99.5%) whose weight was measured in advance was provided as the sample 4 and placed in position. The temperature of the stage 3 was set to 30° C. Into the chamber, $ClF_3$ was fed at an overall flow rate of 100 sccm. The pressure inside the chamber was set to 50 kPa. After the gas was kept flowing over 5 minutes, the inside of the chamber was evacuated. In the subsequent second step, the stage 3 was heated to 50° C. upon confirming that the pressure inside the chamber was 100 Pa or lower. After the lapse of 10 minutes, the heating of the stage 3 was stopped. The inside of the chamber was replaced with nitrogen gas. The chamber was opened to take the sample out. The weight of the sample 4 was again measured. A weight decrease rate of the sample 4 was determined by the following equation.

$$\text{Weight decrease rate} = \frac{(\text{Weight before etching} - \text{Weight after etching})}{\text{Weight before etching}}$$

Herein, the average particle size of the powder used in each Example refers to a number-based arithmetic mean particle diameter as determined by image analysis according to microscopic method (JIS Z 8827-1).

Examples 1-2 and 1-3 and Comparative Examples 1-1, 1-2 and 1-3

In Example 1-2, the etching test was conducted in the same manner as in Example 1-1, except that the second step was performed under the flow of nitrogen gas at a pressure of 26.7 kPa.

In Example 1-3 and Comparative Examples 1-1 and 1-2, the etching test was conducted in the same manner as in Example 1-1, except that $IF_7$, $F_2$ or HF was used in the first step.

In Comparative Example 1-3, the etching test was conducted in the same manner as in Example 1-1, except that, after the inside of the chamber was replaced with nitrogen gas upon completion of the first step without performing the second step, the sample 4 was taken out of the chamber and measured for its weight.

Examples 2-1 and 2-2 and Comparative Examples 2-1 and 2-2

In Examples 2-1 and 2-2 and Comparative Examples 2-1 and 2-2, the etching test was conducted in the same manner as in Examples 1-1 and 1-3 and Comparative Examples 1-1 and 1-2, respectively, except that the sample 4 used was a TaN powder (average particle size: 3 μm, purity: >90%).

Examples 3-1 and 3-2 and Comparative Examples 3-1 and 3-2

In Examples 3-1 and 3-2 and Comparative Examples 3-1 and 3-2, the etching test was conducted in the same manner as in Examples 1-1 and 1-3 and Comparative Examples 1-1 and 1-2, respectively, except that the sample 4 used was a Ta powder (average particle size: 10 μm, purity: 99.9%).

Examples 4-1 and 4-2 and Comparative Examples 4-1 and 4-2

In Examples 4-1 and 4-2 and Comparative Examples 4-1 and 4-2, the etching test was conducted in the same manner as in Examples 1-1 and 1-3 and Comparative Examples 1-1 and 1-2, respectively, except that the sample 4 used was a Nb powder (average particle size: 45 μm, purity: 99.9%).

Comparative Examples 5-1, 5-2 and 5-3

In Comparative Examples 5-1, 5-2 and 5-3, the etching test was conducted in the same manner as in Example 1-1, except that the sample 4 used was a $SiO_2$ powder (average particle size: 55 μm, purity: 99.999%), a SiN powder (average particle size: 45 μm, purity: >98%) or a TiN powder (average particle size: 45 μm, purity: 99%).

The above-explained Examples and Comparative Examples are summarized in TABLE 1.

TABLE 1

| | | First step | | Second step | | Weight |
|---|---|---|---|---|---|---|
| | Etching target | Flowing gas | Stage temp. | Atmosphere | Stage temp. | decrease rate [%] |
| Ex. 1-1 | Ru | $ClF_3$ | 30° C. | vacuum | 50° C. | 100 |
| Ex. 1-2 | Ru | $ClF_3$ | 30° C. | $N_2$ | 50° C. | 100 |
| Ex. 1-3 | Ru | $IF_7$ | 30° C. | vacuum | 50° C. | 75 |
| Comp. Ex. 1-1 | Ru | $F_2$ | 30° C. | vacuum | 50° C. | <1 |
| Comp. Ex. 1-2 | Ru | HF | 30° C. | vacuum | 50° C. | <1 |
| Comp. Ex. 1-3 | Ru | $ClF_3$ | 30° C. | — | — | weight increase |
| Ex. 2-1 | TaN | $ClF_3$ | 30° C. | vacuum | 50° C. | 95 |
| Ex. 2-2 | TaN | $IF_7$ | 30° C. | vacuum | 50° C. | 60 |
| Comp. Ex. 2-1 | TaN | $F_2$ | 30° C. | vacuum | 50° C. | <1 |

TABLE 1-continued

| | Etching target | First step Flowing gas | Stage temp. | Second step Atmosphere | Stage temp. | Weight decrease rate [%] |
|---|---|---|---|---|---|---|
| Comp. Ex. 2-2 | TaN | HF | 30° C. | vacuum | 50° C. | <1 |
| Ex. 3-1 | Ta | ClF$_3$ | 30° C. | vacuum | 50° C. | 98 |
| Ex. 3-2 | Ta | IF$_7$ | 30° C. | vacuum | 50° C. | 55 |
| Comp. Ex. 3-1 | Ta | F$_2$ | 30° C. | vacuum | 50° C. | <1 |
| Comp. Ex. 3-2 | Ta | HF | 30° C. | vacuum | 50° C. | <1 |
| Ex. 4-1 | Nb | ClF$_3$ | 30° C. | vacuum | 50° C. | 97 |
| Ex. 4-2 | Nb | IF$_7$ | 30° C. | vacuum | 50° C. | 62 |
| Comp. Ex. 4-1 | Nb | F$_2$ | 30° C. | vacuum | 50° C. | <1 |
| Comp. Ex. 4-2 | Nb | HF | 30° C. | vacuum | 50° C. | <1 |
| Comp. Ex. 5-1 | SiO$_2$ | ClF$_3$ | 30° C. | vacuum | 50° C. | <1 |
| Comp. Ex. 5-2 | SiN | ClF$_3$ | 30° C. | vacuum | 50° C. | <1 |
| Comp. Ex. 5-3 | TiN | ClF$_3$ | 30° C. | vacuum | 50° C. | <1 |

As is seen from Example 1-1, it was possible to etch Ru by flowing ClF$_3$ at 30° C. in the first step and then heating at 50° C. under the vacuum atmosphere in the second step. Similarly, it was possible to etch Ru in Example 1-3 where IF$_7$ was used in the first step and in Example 1-2 where the nitrogen gas atmosphere was used in the second step. On the other hand, there did not take place etching of Ru in Comparative Examples 1-1 and 1-2 where F$_2$ or HF was used in the first step. Further, there was seen a weight increase of the sample without allowing Ru to be etched in Comparative Example 1-3 where only the first step was performed. It is considered that such a weight increase was caused by the formation of a substance assumed to be a fluoro-halogeno metal complex such as [ClF$_2$][RuF$_6$].

As is seen from Examples 2-1, 2-2, 3-1, 3-2, 4-1 and 4-2, it was also possible to etch each of TaN, Ta and Nb by flowing ClF$_3$ or IF$_7$ at 30° C. in the first step and then heating at 50° C. under the vacuum atmosphere in the second step. On the other hand, there did not take place etching of TaN, Ta and Nb in Comparative Examples 2-1, 2-2, 3-1, 3-2, 4-1 and 4-2 where F$_2$ or HF was used in the first step.

In Comparative Examples 5-1, 5-2 and 5-3 where SiO$_2$, SiN or TiN was used as the etching target under the same conditions as in Example 1-1, there hardly took place etching of the etching target. It is thus apparent that the etching method according to Example 1-1 is usable for selective etching of Ru, TaN, Ta or Nb relative to SiO$_2$, SiN or TiN. Particularly in the case of using ClF$_3$, the etching selectivity of Ru to SiO$_2$ (on the weight basis) is 100 or higher; and the selectivity of TaN, Ta or Nb to SiO$_2$ (on the weight basis) is 95 or higher.

INDUSTRIAL APPLICABILITY

The present invention is effectively applicable to the manufacturing of a semiconductor device using a material containing a stable metal element such as Ru or Ta as an element-constituting material, the cleaning of an inner surface of a chamber used during the manufacturing of the semiconductor device, and the like.

DESCRIPTION OF REFERENCE NUMERALS

1: Reaction equipment
2: Chamber
3: Stage
4: Sample
5: Gas introduction port
6: Gas discharge line
7: Pressure gauge

The invention claimed is:

1. A dry etching method, comprising:
a first step of bringing a processing gas containing a fluorine-containing interhalogen compound into contact with a material containing a specific metal element at a reaction temperature of 0° C. to 100° C., thereby forming a reaction product of the specific metal element and the fluorine-containing interhalogen compound as a solid product; and
a second step of evaporating the solid product by heating the solid product in an atmosphere of flow of at least one kind of inert gas selected from the group consisting of N, He, Ne, Ar, Kr and Xe at 0.1 kPa to 101.3 kPa or vacuum atmosphere of 0.1 Pa to 100 Pa at a heating temperature higher than the reaction temperature of the first step,
the specific metal element being one or more kinds of elements selected from the group consisting of Ru, Ta and Nb.

2. The dry etching method according to claim 1,
wherein the fluorine-containing interhalogen compound is one or more kinds of compounds selected from the group consisting of ClF, BrF, ClF$_3$, BrF$_3$, IF$_3$, ClF$_5$, BrF$_5$, IF$_5$ and IF$_7$.

3. The dry etching method according to claim 2,
wherein the fluorine-containing interhalogen compound is ClF$_3$, IF$_7$ or a mixture thereof.

4. The dry etching method according to claim 1,
wherein the material containing the specific metal element includes one or more selected from the group consisting of a simple substance of Ru, a simple substance of Ta, a nitride of Ta and a simple substance of Nb.

5. The dry etching method according to claim 1,
wherein the reaction temperature of the first step is higher than or equal to 15° C. and lower than or equal to 50° C., and
wherein the heating temperature of the second step is higher than or equal to 50° C. and lower than or equal to 250° C.

6. The dry etching method according to claim 1,
wherein the material containing the specific metal element includes one or more selected from the group consisting of a simple substance of Ru, a simple substance of Ta, a nitride of Ta and a simple substance of Nb,
wherein the reaction temperature of the first step is higher than or equal to 0° C. and lower than or equal to 50° C., and
wherein the heating temperature of the second step is 5° C. or more higher than the reaction temperature of the first step.

7. The dry etching method according to claim 1,
wherein the material is in a thin-film shape.

8. The dry etching method according to claim 1,
wherein the dry etching method is applied to an etching target containing both of the material containing the specific metal element and a material containing silicon oxide, silicon nitride or titanium nitride, whereby the material containing the specific metal element is etched selectively relative to the material containing silicon oxide, silicon nitride or titanium nitride.

9. A semiconductor device manufacturing method, comprising:
   forming a layer of a material containing a specific metal element on a semiconductor substrate;
   forming a mask with a predetermined pattern on the layer of the material containing the specific metal element; and
   removing a part of the layer of the material containing the specific metal element from the semiconductor substrate by the dry etching method according to claim 1 and thereby transferring the pattern to the layer of the material containing the specific metal element.

10. The semiconductor device manufacturing method according to claim 9,
   wherein the semiconductor substrate is a silicon substrate having a silicon oxide layer on a surface thereof, and
   wherein the layer containing the specific metal element is formed on the silicon oxide layer.

11. The dry etching method according to claim 1,
   wherein the specific metal element is at least one element selected from the group consisting of Ru and Nb.

12. The dry etching method according to claim 11,
   wherein the material containing the specific metal element is a simple substance of Ru or a simple substance of Nb.

13. A chamber cleaning method, comprising:
   a first step of bringing a processing gas containing a fluorine-containing interhalogen compound into contact with a chamber deposit containing a specific metal element at a reaction temperature of 0° C. to 100° C., thereby forming a reaction product of the specific metal element and the fluorine-containing interhalogen compound as a solid product; and
   a second step of evaporating the solid product by heating the solid product in an atmosphere of flow of at least one kind of inert gas selected from the group consisting of N, He, Ne, Ar, Kr and Xe at 0.1 kPa to 101.3 kPa or vacuum atmosphere of 0.1 Pa to 100 Pa at a temperature higher than the reaction temperature of the first step, thereby removing the chamber deposit from an inner surface of the chamber.

14. The chamber cleaning method according to claim 13,
   wherein the specific metal element is at least one element selected from the group consisting of Ru and Nb.

15. The chamber cleaning method according to claim 14,
   wherein the material containing the specific metal element is a simple substance of Ru or a simple substance of Nb.

16. A dry etching method, comprising:
   a first step of bringing a processing gas containing a fluorine-containing interhalogen compound into contact with a material containing a specific metal element at a reaction temperature ranging from 15° C. to 50° C., thereby forming a reaction product of the specific metal element and the fluorine-containing interhalogen compound as a solid product; and
   a second step of evaporating the solid product by heating the solid product, at a heating temperature ranging from 50° C. to 250° C. and being higher than the reaction temperature of the first step, in an atmosphere of flow of at least one kind of inert gas selected from the group consisting of $N_2$, He, Ne, Ar, Kr and Xe at 0.1 kPa to 101.3 kPa or vacuum atmosphere of 0.1 Pa to 100 Pa,
   the specific metal element being one or more kinds of elements selected from the group consisting of Ru, Ta and Nb.

17. The dry etching method according to claim 16,
   wherein the specific metal element is at least one element selected from the group consisting of Ru and Nb.

18. The dry etching method according to claim 17,
   wherein the material containing the specific metal element is a simple substance of Ru or a simple substance of Nb.

* * * * *